United States Patent [19]

Takahashi

[11] Patent Number: 5,520,743
[45] Date of Patent: May 28, 1996

[54] PROCESSING APPARATUS WITH MEANS FOR ROTATING AN OBJECT MOUNTING MEANS AND A DISK BODY LOCATED IN THE MOUNTING MEANS DIFFERENTLY RELATIVE TO EACH OTHER

[75] Inventor: Nobuaki Takahashi, Hachioji, Japan

[73] Assignee: Tokyo Electron Kabushiki Kaisha, Tokyo, Japan

[21] Appl. No.: 114,064

[22] Filed: Aug. 31, 1993

[30] Foreign Application Priority Data

Sep. 3, 1992 [JP] Japan ..................... 4-260739

[51] Int. Cl.⁶ ................................. C23C 16/00
[52] U.S. Cl. ................................. 118/730
[58] Field of Search ..................... 118/728, 729, 118/730, 731, 732; 156/345

[56] References Cited

U.S. PATENT DOCUMENTS

| | | | |
|---|---|---|---|
| 4,468,283 | 8/1984 | Ahmed | 156/345 |
| 4,749,440 | 6/1988 | Blackwood et al. | 156/345 |
| 4,785,962 | 11/1988 | Toshima . | |
| 4,788,994 | 12/1988 | Shinbara | 156/345 |
| 4,825,808 | 5/1989 | Takahashi et al. . | |
| 5,002,011 | 3/1991 | Ohmine et al. | 118/730 |
| 5,135,608 | 8/1992 | Okutani | 118/728 |
| 5,248,380 | 9/1993 | Tanaka | 156/646 |

FOREIGN PATENT DOCUMENTS

WO90/10949  9/1990  WIPO .

*Primary Examiner*—George Fourson
*Assistant Examiner*—Brian K. Dutton
*Attorney, Agent, or Firm*—Beveridge, DeGrandi, Weilacher & Young

[57] ABSTRACT

There are provided a treatment chamber for removing natural oxide films formed on the surface and the underside of an object to be treated, e.g., a semiconductor wafer, in treating gas ambient atmosphere, holding member for holding the object to be treated in the treatment chamber, and a mounting member with, e.g., pins erected thereon, and a disk body disposed inside the mounting member. The mounting member and the disk body are rotated relatively to each other. The relative rotation of the mounting member and the disk body generates flows of the treating gas, so that the natural oxide films are homogeneously removed from the entire surface and underside of the object to be treated.

11 Claims, 7 Drawing Sheets

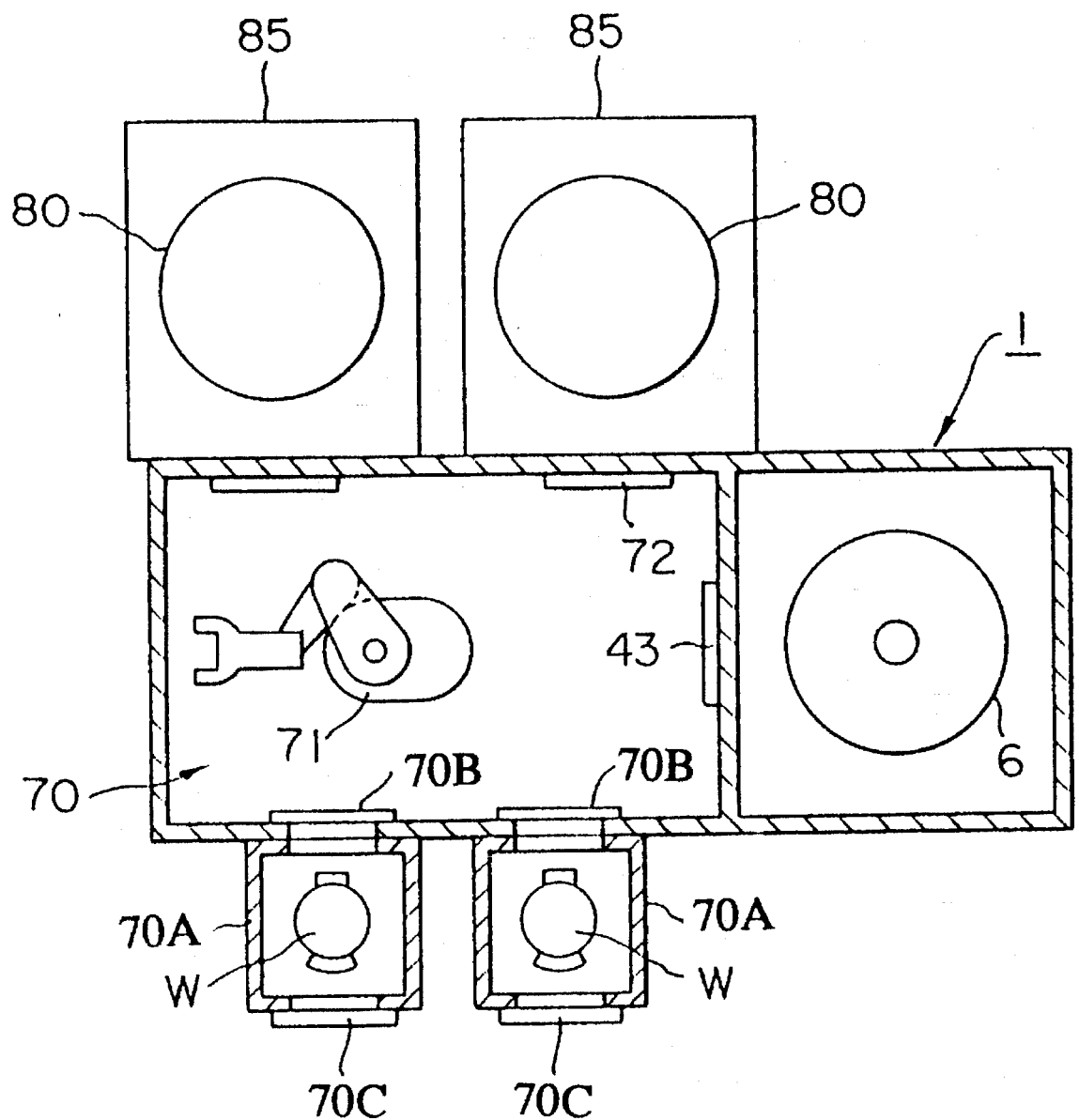
F I G. 2

PROCESSING APPARATUS WITH MEANS FOR ROTATING AN OBJECT MOUNTING MEANS AND A DISK BODY LOCATED IN THE MOUNTING MEANS DIFFERENTLY RELATIVE TO EACH OTHER

BACKGROUND OF THE INVENTION

This invention relates to a processing apparatus.

In a conventional processing apparatus objects to be treated, e.g., semiconductor wafers, are loaded in a treatment chamber and rotated therein to allow a treating gas to react with the wafers.

In a processing apparatus, e.g., in a natural oxide film removing apparatus for removal a natural oxide film formed on a surface of a semiconductor wafer, a required liquid, e.g., a mixed liquid of hydrogen fluoride and water, is held in an upper part of the interior of the treatment chamber at atmospheric pressure or a positive pressure, and hydrogen fluoride vapor generated therefrom is diffused into the treatment chamber. A semiconductor wafer is typically positioned in the treatment chamber at a lower part thereof on a rotary disk-shaped mount with a surface to be treated (surface) facing upward. The wafer on the mount is rotated by the rotation of the mount. The hydrogen fluoride vapor is caused to flow in rotating currents by the rotation of the semiconductor wafer to react with the surface of the semiconductor wafer. A natural oxide film formed on the surface of the semiconductor wafer is removed thereby.

The rotary mount is rotated together with an object to be treated mounted thereon. Vortexes of the rotating currents are generated at the peripheral part of the underside of the object to be treated. Accordingly a removing rate (etching rate) is much higher at the peripheral part than at the central part of the underside of the object to be treated. As a result, a natural oxide film formed on the underside of the object to be treated cannot be homogeneously removed.

Failure to homogeneously remove a natural oxide film (sticking pollutants, impurities, etc.) on the underside of the object to be treated results in a problem in product yields in subsequent treating apparatuses.

SUMMARY OF THE INVENTION

An object of this invention is to provide a single sheet (wafer) processing apparatus which can homogeneously and simultaneously remove impurities on the surface and the underside of an object to be treated.

The processing apparatus according to this invention comprises a treatment chamber for treating an object to be treated with a treating gas, and a ring-shaped mount with a holding mechanism for holding the object to be treated in the treatment chamber, the mount being connected to a rotation mechanism, and a disk body being provided inside the mount, the disk body being rotated relative to the mount.

In this invention having such structure, a relative rotation velocity difference between the ring-shaped mount holding the object to be treated, and the disk body located inside the mount, which may be stationary, causes more homogeneous flows of a treating gas on the surface and the underside of the object to be treated, whereby the surface and the underside of the object to be treated can be simultaneously and homogeneously treated.

BRIEF DESCRIPTION OF THE DRAWINGS

FIG. 2 is a plan view of the processing system of FIG. 1.

DETAILED DESCRIPTION OF THE PREFERRED EMBODIMENTS

First Embodiment

Figure 1:
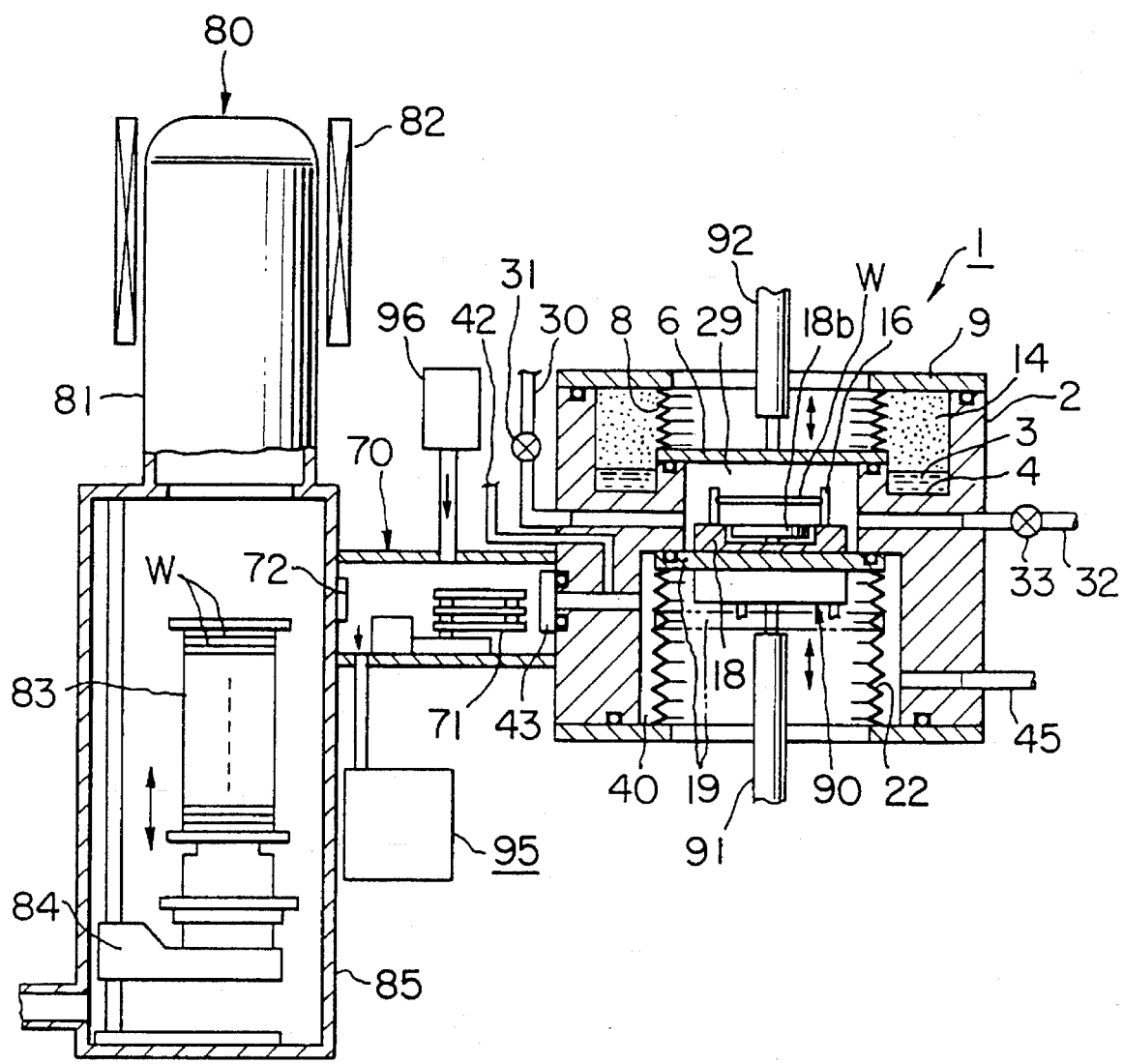
FIG. 1 is a general structural view of a processing system including the processing apparatus (natural oxide film removing apparatus) according to a first embodiment of this invention connected to a batch processing CVD apparatus.

The processing apparatus according a first embodiment of this invention in which this invention is applied to a natural oxide film removing apparatus will be explained.

As shown in FIGS. 1 to 4, the natural oxide film forming apparatus 1 comprises a cylindrical vessel 2 of a corrosion-resistant material.

In an upper part of the interior of the vessel 2 there is provided an annular liquid holding portion 4 for keeping a liquid mixture 3 (e.g., 5% HF and 95% $H_2O$) e.g., hydrogen fluoride, and water. On the inner circumference of the liquid holding portion 4 there is provided a disk-shaped shut-off lid 6 which has the same diameter as a radial thickness of an inner circumferential wall 5 with an inside circumferential wall 27, and a first ring-shaped sealing body 7 (e.g., an O-ring) made of a corrosion-resistant material for tightly sealing the liquid holding portion 4. A first extensible bellows 8 of a corrosion-resistant material which bellows 8 is cylindrical and hollow, has one end air-tightly connected to one circumferential end of the lid 6. The bellows 8 has its other end air-tightly connected to an upper lid 9.

Figure 3:
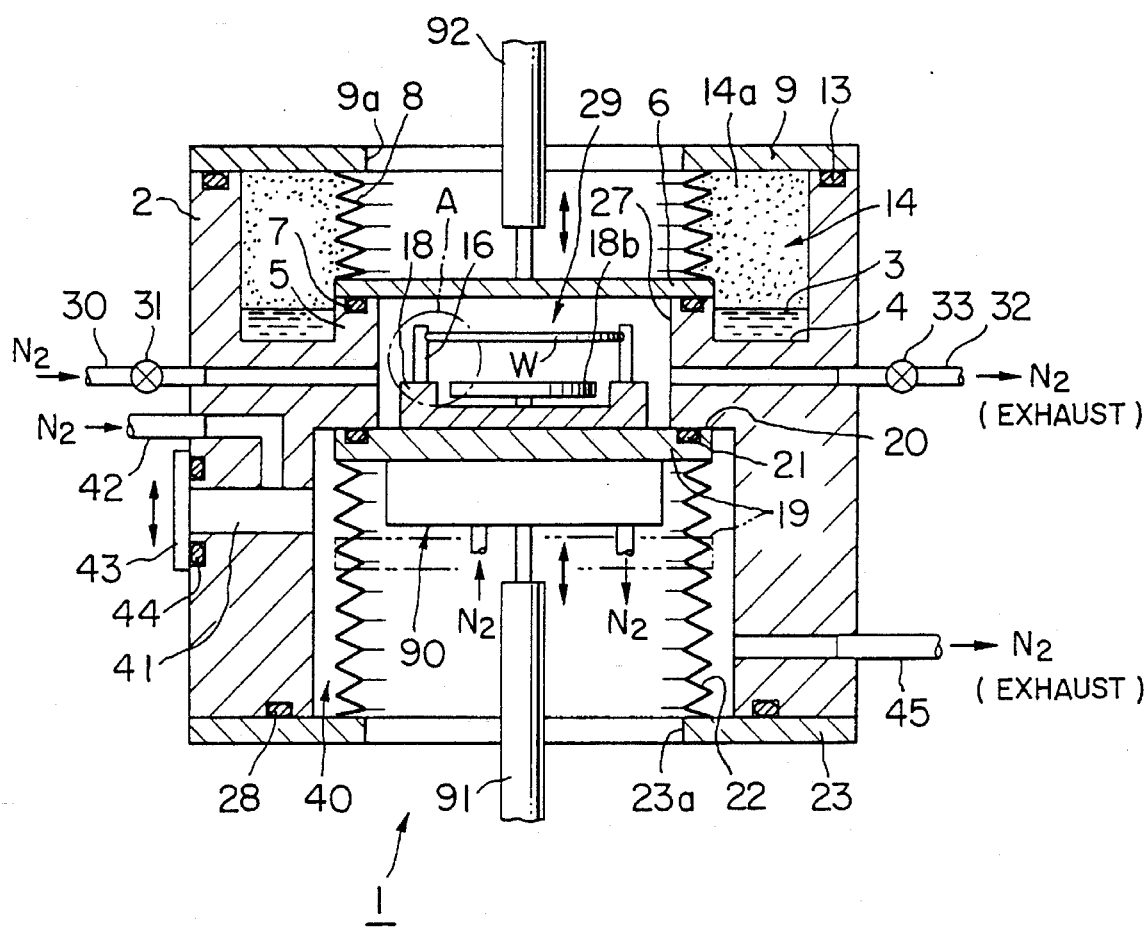
FIG. 3 is a sectional view of the natural oxide film removing apparatus according to the first embodiment of this invention, in which an object to be treated is held by pins and the treatment chamber and the treating gas chamber are air-rightly separated from each other.

The upper lid 9 is formed in the shape of a plane disk shape of a corrosion-resistant material, and, as shown in FIG. 3, has a small circular opening 9a of a smaller diameter than an inner diameter of the bellows 8. In the opening 9a there is provided an opening and closing mechanism 92 for vertically moving the shut-off lid 6, e.g., via an air cylinder. The opening and closing mechanism 92 is moved vertically to close and open the lid 6.

The upper lid 9 is air-tightly connected to the vessel 2 at the outer circumference by a second sealing body 13 in the form of an o-ring of a corrosion-resistant material provided circumferentially on the upper end of the vessel 2, whereby a treating gas-chamber 14 (in atmospheric pressure) filled with the vaporized treating gas 14a (HF vapor: fluoride 5%, water 95%) from the annular liquid holding portion 4.

Figure 6:
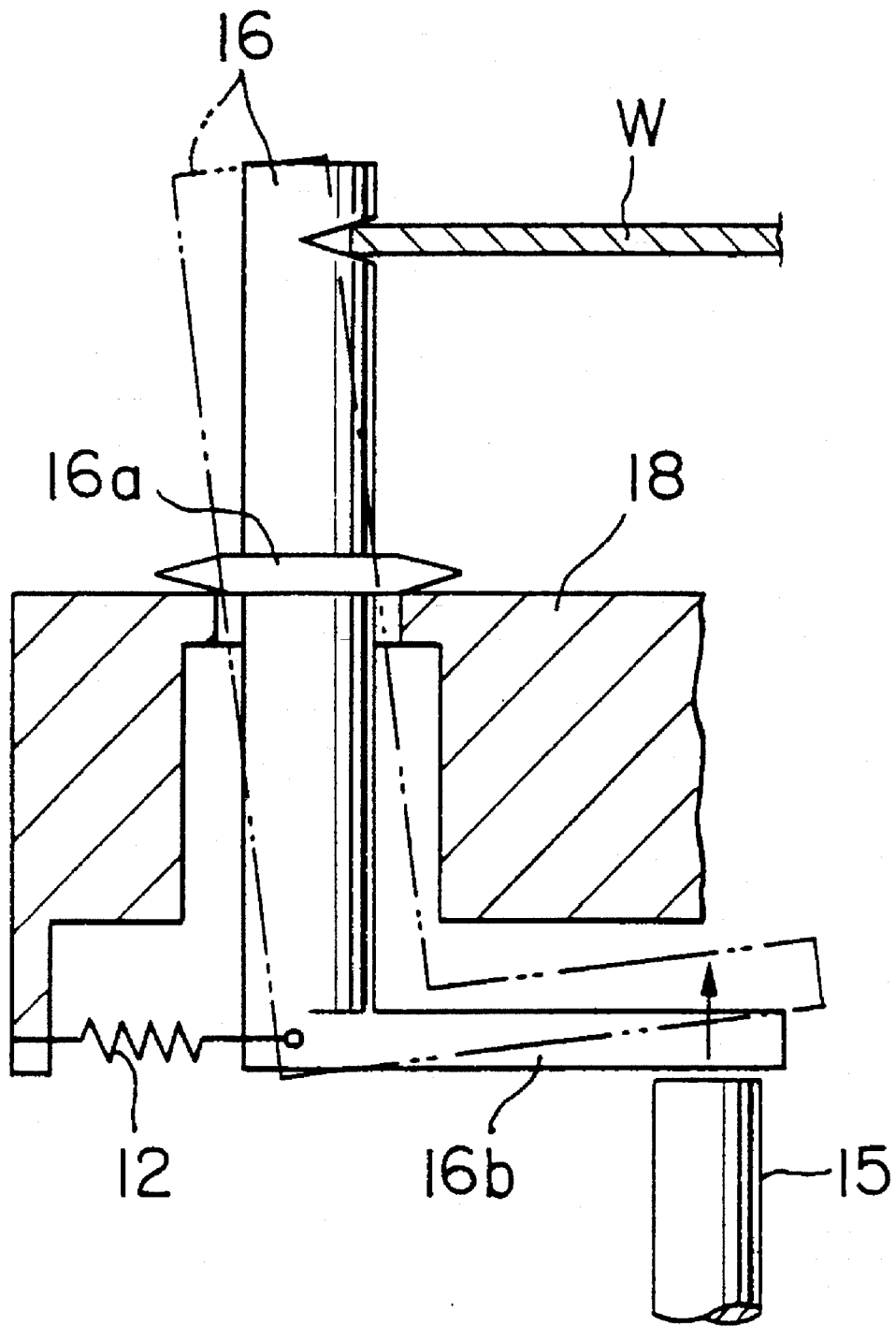
FIG. 6 is an enlarged view of the part A of FIG. 3, the holding mechanism (pins) of the natural oxide film removing apparatus of FIG. 3.

A treatment chamber 29 is provided below the treating gas chamber 14 and at the center of the vessel 2. In the treatment chamber 29 there is disposed a mount 18 for placing an object to be treated, e.g., a semiconductor wafer W. The semiconductor wafer W is held by a holding mechanism on the mount 18 by pins 16 which are disengageably radially movable (FIG. 6).

Figure 5:
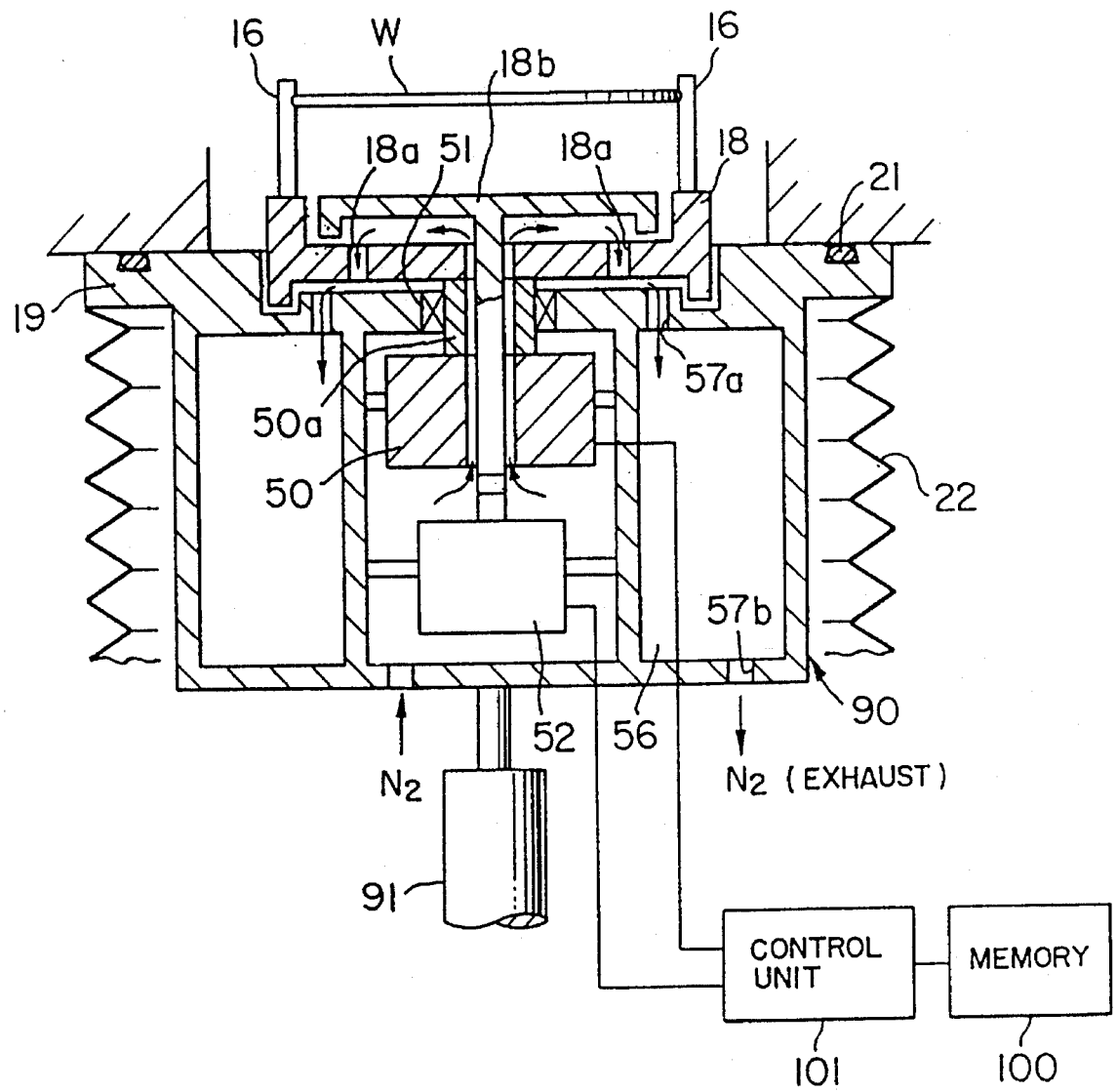
FIG. 5 is a sectional view of the rotation means for rotating the mount and the disk body of the natural oxide film removing apparatus of FIG. 3.

As shown in FIG. 5, a rotation mechanism 90 is driven by a rotary shaft 50a of, e.g., a hollow motor 50 connected to the mount 18 through a bearing 51 provided on a middle lid 19. The pins 16 are provided in a plural number (e.g., 3) on the upper surface of the ring-shaped mount 18. A first exhaust port 57a for discharging the mixed gas is formed in the upper part of the second space 56, and a second exhaust port 57b for discharging the mixed gas is formed in the lower part of the space 56. An aspirator (not shown), for example, which exhausts, using a flow of a gas, is connected to the exhaust ports to discharge the mixed gas, and air is caused to flow through the system.

As shown in FIG. 3, a third sealing ring 21 of a corrosion resistant material is provided on the periphery of the middle lid 19 which is pressed against the underside of the circumferential member 20 for air-tight sealing.

A second cylindrical hollow bellows 22 of a flexible corrosion-resistant material has one end air-tightly connected to the outer periphery of the middle lid 19 and the other end air-tightly connected to a bottom lid 23.

The bottom lid 23 is formed of a corrosion resistant material in a planar disk, and has a circular opening 23a at an inner part thereof, whose diameter is smaller than an inner diameter of the bellows 22. Inside the opening 23a and the bellows 22 there are provided a lift mechanism 91, e.g., an air cylinder, for vertically moving the middle lid 19 and the rotation mechanism 90.

As shown in FIG. 3, the outer periphery of the upper surface of the bottom lid 23 is pressed against a fourth sealing ring 28 of a corrosion resistant material provided on the underside of the bottom of the vessel 2 so as to air-tightly seal the vessel 2 at the bottom.

A feed pipe 30 for supplying a purging inert gas, e.g., $N_2$ gas, is connected to one side of the inner circumferential wall of the treatment chamber 20 through a first shut-off valve 31, and a first exhaust pipe 32 for exhausting $N_2$ gas from the treatment chamber 29 is connected through a second shut-off valve 33 to the other side of inner circumferential wall. The first exhaust gas 32 is connected to treating pipe discharging means not shown.

A preliminary chamber 40 is defined below the treatment chamber 29 by the middle lid 19, the bottom lid 23 and the vessel 2.

A loading passage 41 is formed in one side wall of the preliminary chamber 40 for loading a semiconductor wafer W. An introduction pipe 42 is connected to the load passage 41 at the middle 10 part thereof for continuously introducing an inert gas, e.g., $N_2$ gas.

A second exhaust pipe 45 is connected to the other side wall of the preliminary chamber 40 for discharging the $N_2$ gas. A gate valve 43, is provided for closing the loading passage 41, and the vessel 2 can be air-tightly closed by means of a fifth sealing body 44 of a corrosion resistant material.

As shown in FIGS. 1 and 2, the natural oxide film removing apparatus includes a load lock chamber 70 air-tightly connected to the preliminary chamber 40 through the gate valve 43. A semiconductor wafer W is loaded into preliminary chamber 40 by a wafer carrying mechanism 71 in the load lock chamber 70 to be carried out of the preliminary chamber 40.

The load lock chamber 70 is connected to evacuation means 95 and a $N_2$ gas supply means 96 so that the load lock chamber 70 can be evacuated and then provided with a $N_2$ ambient atmosphere containing no oxygen.

The load lock chamber 70 is arranged so that a semiconductor wafer W is loaded in and out of a heat-processing apparatus, e.g., a batch CVD apparatus 80 in $N_2$ gas ambient atmosphere. The load lock chamber 70 is also arranged so that a semiconductor wafer W can be loaded through the gate valves 70B, 70C both in atmospheric air and $N_2$ gas ambient atmosphere.

The natural oxide film removing apparatus according to the first embodiment has the aforementioned structure.

The processing operation of the processing apparatus according to this invention having the above-described structure will now be explained.

In FIG. 1, the middle lid 19 is lowered by the lift mechanism 91 to the position indicated by the chain line to open the gate valve 43. A semiconductor wafer W is carried by the wafer carrying mechanism 71 into the preliminary chamber 40 from the load lock chamber 70.

There, the semiconductor wafer W is held by the holding mechanism of FIG. 6. That is, at least three pins 16 are erected on the upper surface of the mount 18, and the pins 16 are swingably held on the surface of the mount 18 by middle flanges 16a. The pins 16 are extended downward through the mount 18, have the lower ends formed in bent arms 16a, and are normally urged by springs 12 in a direction of closure of the pins 16. The semiconductor wafer W is locked by notches formed in the upper part of the pins 16, and plungers 15 are pressed upward by suitable drive means to hold the semiconductor wafer W.

Further the pins 16 are closed by the closing mechanism and hold the semiconductor wafer W at the periphery thereof. Then the wafer carrying mechanism 71 is returned to the load lock chamber 70, and the gate valve 43 is closed to air-tightly seal the vessel 2.

In this state, as shown in FIG. 3, the treating gas chamber 14 is air-tight with the shut-off lid 6 air-tightly positioned at the upper end of the inner circumferential wall 5. At this time, the shut-off valves 31, 33 are opened to supply an inert gas, e.g., $N_2$ gas, from the $N_2$ gas source to purge the treatment chamber 29.

Then, the middle lid 19 is lifted by the lift mechanism 91 to the position indicated by the solid line, and the sealing body 21 on the periphery of the middle lid 19 is brought into press-contact with the underside of the annular member 20 on the inner side of the vessel 2, so that the treatment chamber 19 and the preliminary chamber 40 are separated air-tightly as in FIGS. 1 and 3.

Figure 4:
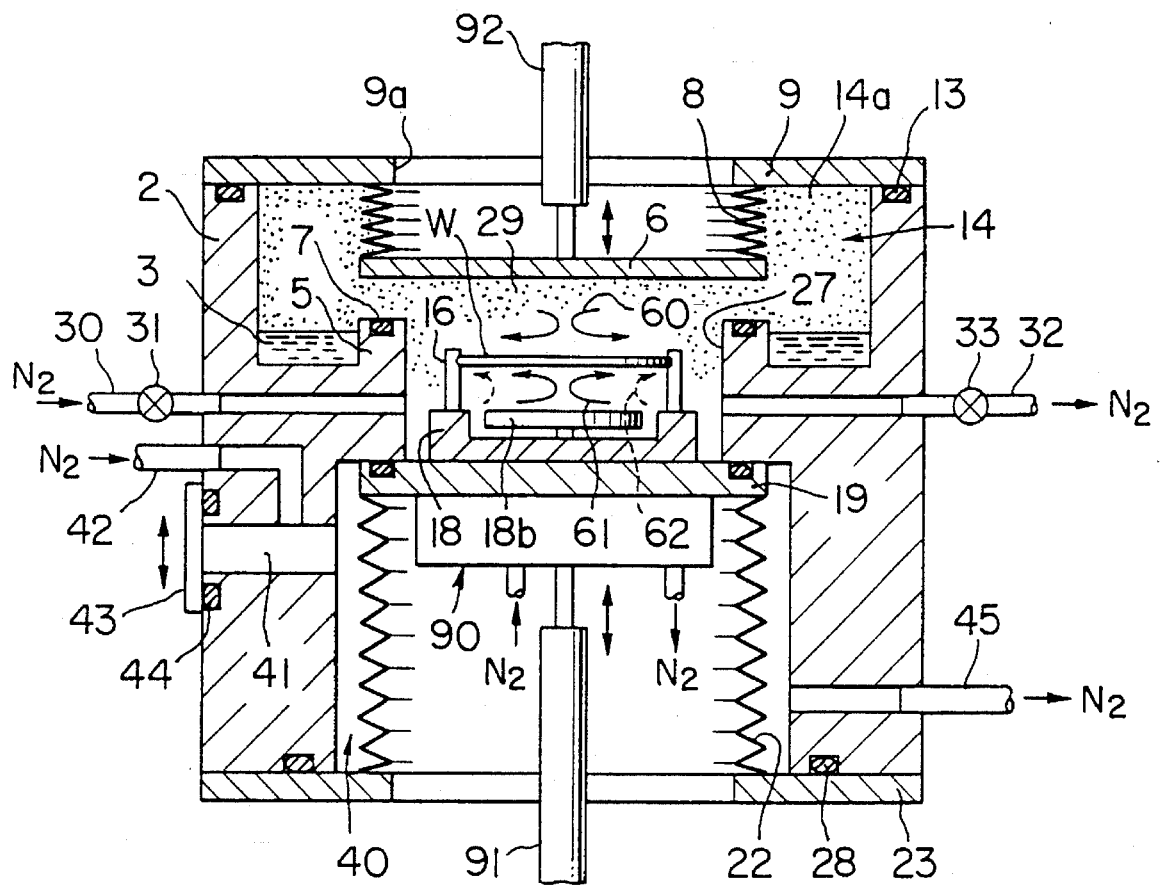
FIG. 4 is a view of the natural oxide film removing apparatus of FIG. 3, wherein the treatment chamber and the treating gas chamber are in communication with each other.

Then, the shut-off valves 31, 33 are closed, so that the $N_2$ gas supply is halted. As shown in FIG. 4, the shut-off lid 6 is lifted by the opening and closing mechanism 92 to communicate the treating gas chamber 14 with the treatment chamber 29. The ring-shaped mount 18 holding the semiconductor wafer W is rotated by the hollow motor 50 as shown in FIG. 5 clock-wise at, e.g., 500–2000 revolutions/min.

In synchronization with the rotation of the ring-shaped mount 18, the disk body 18b disposed inside the mount 18 is rotated in a direction of rotation of the mount 18 by the stepping motor 52 (e.g., at 0–1000 revolutions/min.).

The rotation of the ring-shaped mount 18 and the disk body 18b at different rotation velocities causes the treating gas 14a (HF vapor) in the treating gas chamber 14 to be drawn onto the surface of the semiconductor wafer W in gas flows 60. The gas flows 60 and 61 of the treating gas 14a homogeneously remove an unnecessary natural oxide film on the surface of the semiconductor wafer W.

The gas flows 60 are present on the upper surface of the semiconductor wafer W, and gas flows 61 take place on the underside of the semiconductor wafer W. A natural oxide film formed on the underside of the semiconductor wafer W is homogeneously removed.

In a conventional processing apparatus, the ring-shaped mount 18 and the disk body 18a are one integrated unit and are rotated together, hence there is no rotation velocity difference between them. Accordingly, gas flows on the underside of the semiconductor wafer W flow as underside flows 62 and become vortexes on the periphery of the underside as shown in FIG. 4 with the arrow (dotted line). All of a natural oxide film formed on the underside of the semiconductor wafer W is not removed, and the natural oxide film on the central part of the underside remains.

Returning to the present invention, after the natural oxide film on the semiconductor wafer W has been removed, the rotation of the mount 18 and the disk body 18a ceases. Then the shut-off lid 6 is lowered by the opening and closing mechanism 92 to close as shown in FIG. 3, and the treating gas chamber 14 and the middle chamber 29 are divided into separate chambers.

Next, the shut-off valve 31 is opened to let $N_2$ gas into the treating gas chamber 29 to dilute a concentration of residual treating gas therein, and further the shut-off valve 33 is opened to completely let out residual gas through the exhaust pipe 32.

Then, the middle lid 19 is lowered by the lift mechanism 91 as indicated by the chain line in FIGS. 1 and 3 to again open the gate valve 43. Further, the semiconductor wafer W which has the natural oxide films removed is released from the pins 16 and is carried out to the load lock chamber 70 by the wafer carrying mechanism 71 in FIG. 1, and the gate valve 43 is closed.

Then the semiconductor wafer W which has been carried out to the load lock chamber 70 by the wafer carrying mechanism 71 is carried to a CVD apparatus 80 through the second gate valve 72 and placed in a wafer boat 83 in another load lock chamber 85. When a number of wafers for batch processing, e.g., 100 sheets of wafers, are placed in the boat 83, a boat lift mechanism (elevator) 84 is raised to load the wafer boat 83 into a process tube 81 of the CVD apparatus. Then a heating coil 82 is heated to conduct the heat treatment (CVD).

Such carrying in/out operation of a semiconductor wafer W may be successively repeated.

Advantageous effects of the first embodiment having the above-described structure will be explained.

1) Due to a rotation velocity difference between the ring-shaped mount 18 and the disk body 18b, the treating gas 14a (HF vapor) filling the treating gas chamber 14 is drawn in gas flows 60 onto the surface of a semiconductor wafer F. A natural oxide film formed on the surface of the semiconductor wafer F is homogeneously removed, and the gas flows 60 flows onto the underside of the semiconductor wafer W to generate underside gas flows 61. The underside gas flows thus homogeneously remove a natural oxide film on the underside of the semiconductor wafer W (e.g., etching rate for $SiO_2$ thermal oxide film: 100 Å/min.).

2) Furthermore, since a natural oxide film formed on the underside of the semiconductor wafer W can be homogeneously removed, in a treating apparatus for conducting a later treatment, e.g., a heat-processing apparatus, even when there is a difference between a thermal expansion of a semiconductor wafer (Si) (linear thermal expansion 2.5 [10-6 deg-1] for a temperature of 293[K]), and that of a natural oxide film ($SiO_2$) (linear thermal expansion 7.4–13.6 [10-6 deg-1] for a temperature of 293 [K]), by conducting the treatment at a high temperature of, e.g., 800°–1200° C., thermal expansions can be made uniform between the central part of the object to be treated, and the periphery thereof. The generation of thermal stresses can be prevented.

3) Since a natural oxide film formed on the underside of an object to be treated, can be homogeneously removed, in a treating apparatus for conducting a later treatment, e.g., a plasma treating apparatus, when the object to be treated is placed on the mount in the treating chamber, e.g., when an electrostatic chuck is used in securing the underside of the object to be treated to the mount, the adhesion can be improved.

4) Since rotation velocities of the ring-shaped mount 18 and of the disk body 18a can be optionally controlled, a rotation difference coefficient can be varied or made to be counter rotating, and treating rates for the surface and underside of an object to be treated can be optionally controlled.

Second Embodiment

Next, the second embodiment of this invention will be explained. Common parts of the second embodiment with the first embodiments have common reference numerals not to repeat their explanation.

Figure 7A:
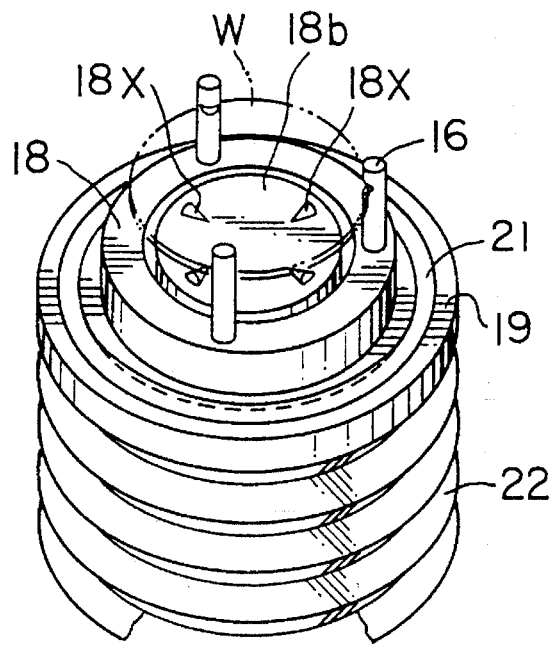
FIGS. 7A–7B are detailed views of the rotary part of the processing apparatus according to this invention, FIG. 7A being a perspective view of the rotary body having rectifiers in the form of projections formed on the surface, FIG. 7B being a perspective view of the rotary body having rectifiers in the form of grooves formed on the surface.

As shown in FIG. 7A, a plurality of rectifiers (the so-called weather strip), e.g., a plurality (e.g., 4) of convex projections 18X, are formed on the upper surface of a disk body 18b circumferentially opposed to each other. These projections 18X function to encourage, as the disk body 18b is rotated, air flows generated on the underside of an object to be treated. A treating rate of a natural oxide film on the underside of the object to be treated can be improved.

Figure 7B:
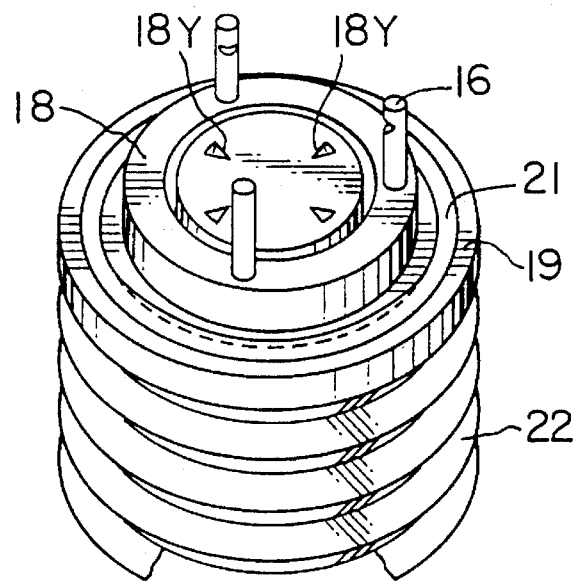

As shown in FIG. 7B, a plurality (e.g., 4) of concave grooves 18X may be formed in place of the projections 18Y on the upper surface of the disk body 18b circumferentially opposed to each other. These grooves 18Y function to encourage, as the disk body 18b is rotated, air flows generated on the underside of an object to be treated. As in the embodiment of FIG. 7A, a treating rate of a natural oxide film on the underside of the object to be treated can be improved, and the treatment can be made homogeneous.

In the above-described embodiments, the processing apparatus according to this invention are applied to natural oxide film treating apparatuses for removing natural oxide films formed on surfaces of semiconductor wafers, but this invention is not limited to these embodiments. This invention is applicable to any apparatus as long as it is for forming homogeneous treatment gas flows on surfaces of objects to be treated, and can be varied and modified in the range of the gist of this invention.

With regard to the rotation difference coefficient, it is not essential that the ring-shaped mount and the disk body are rotated in the same direction, and they may have relatively different rotation velocities, e.g., the disk body may be stationary, and the ring-shaped mount alone be rotated. They may be rotated in opposite directions and have a rotation velocity difference.

It is not essential that the rectifiers on the upper surface of the disk body are convexities or concavities formed circumferentially opposed to each other. They may be convexities or concavities formed in spirals or lines. They may be varied within the scope of the gist of this invention.

Applications of the processing apparatus according to this invention are not limited to natural oxide film removing apparatuses and may be applied to rinse apparatus, etching apparatuses, etc. The treatment apparatus according to this invention is applicable to any treating apparatus as long as it treats objects to be treated with treating gasses in treatment chambers under atmospheric pressure, low pressures, positive pressures.

I claim:

1. A processing apparatus comprising:

means defining a treatment chamber for use in treating an object to be treated in an ambient atmosphere of treating gas;

mounting means, the mounting means being provided with holding means for holding the object to be treated in the treatment chamber;

a disk body disposed inside the mounting means; and rotating means;

the rotating means including means for rotating the mounting means while prohibiting rotation of the disk body, whereby both an upper surface and an underside surface of the object to be treated are treated at the same time.

2. A processing apparatus comprising:

means defining a treatment chamber for use in treating an object to be treated in an ambient atmosphere of treating gas;

mounting means, the mounting means being provided with holding means for holding the object to be treated in the treatment chamber;

a disk body disposed inside the mounting means; and rotating means for rotating the mounting means and the disk body differently relative to each other, whereby both an upper surface and an underside surface of the object to be treated are treated at the same time.

3. The processing apparatus according to claim 2, wherein the rotating means includes means for rotating the mounting means clockwise; and means for rotating the disk body counter-clockwise synchronously with rotation of the mounting means.

4. The processing apparatus according to claim 2, wherein the rotating means includes means for rotating the mounting means clockwise; and means for rotating the disk body clockwise at a rotation rate different from that of the mounting means.

5. The processing apparatus according to claim 2, further comprising at least one rectifier disposed on an upper surface of the disk body.

6. The processing apparatus according to claim 5, wherein the rectifiers are formed of projections.

7. The processing apparatus according to claim 5, wherein the rectifiers are formed of grooves.

8. The processing apparatus according to claim 2, wherein the object to be treated is a semiconductor wafer.

9. The processing apparatus according to claim 2, wherein the treating gas is hydrogen fluoride vapor.

10. The processing apparatus according to claim 2, wherein the treating is for removing natural oxide films from the upper surface and the underside surface of the object to be treated.

11. The processing apparatus according to claim 2, wherein the processing apparatus is connected to a CVD apparatus.

* * * * *